United States Patent [19]

Jochems

[11] 4,374,454

[45] Feb. 22, 1983

[54] METHOD OF MANUFACTURING A SEMICONDUCTOR DEVICE

[75] Inventor: Pieter J. W. Jochems, Eindhoven, Netherlands

[73] Assignee: U.S. Philips Corporation, Tarrytown, N.Y.

[21] Appl. No.: 219,161

[22] Filed: Dec. 22, 1980

[30] Foreign Application Priority Data

Jun. 23, 1980 [NL] Netherlands .................. 8003612

[51] Int. Cl.³ ........................................... H01L 21/22
[52] U.S. Cl. .............................. 29/571; 29/576 W; 148/187
[58] Field of Search ............ 29/571, 576 W; 148/1.5, 148/187, 175

[56] References Cited

U.S. PATENT DOCUMENTS

| | | | |
|---|---|---|---|
| 4,023,195 | 5/1977 | Richman | 148/1.5 |
| 4,101,344 | 7/1978 | Kooi | 148/187 X |
| 4,268,950 | 5/1981 | Chatterjee et al. | 29/571 |
| 4,277,291 | 7/1981 | Cerofolini et al. | 148/1.5 |
| 4,290,184 | 9/1981 | Kuo | 29/571 |

Primary Examiner—G. Ozaki
Attorney, Agent, or Firm—Ronald J. Meetin; Robert T. Mayer; Thomas A. Briody

[57] ABSTRACT

A method is disclosed for providing in a self-registering manner underpasses in a semiconductor device having insulated gate field effect transistors, in which the underpasses below the field oxide connect electrode zones of the field effect transistors together. A first part of field oxide is obtained by local oxidation by means of an oxidation mask. After a first oxidation treatment, a part of the oxidation mask is removed and the semiconductor body is doped locally with As or Sb atoms for the underpasses. The aperture in the doping mask coincides substantially with the part of the oxidation mask removed. This avoids critical alignment in that the masking effect of the first part of the field oxide is used. After the doping treatment, a second oxidation treatment, is carried out to complete the field oxide.

1 Claim, 13 Drawing Figures

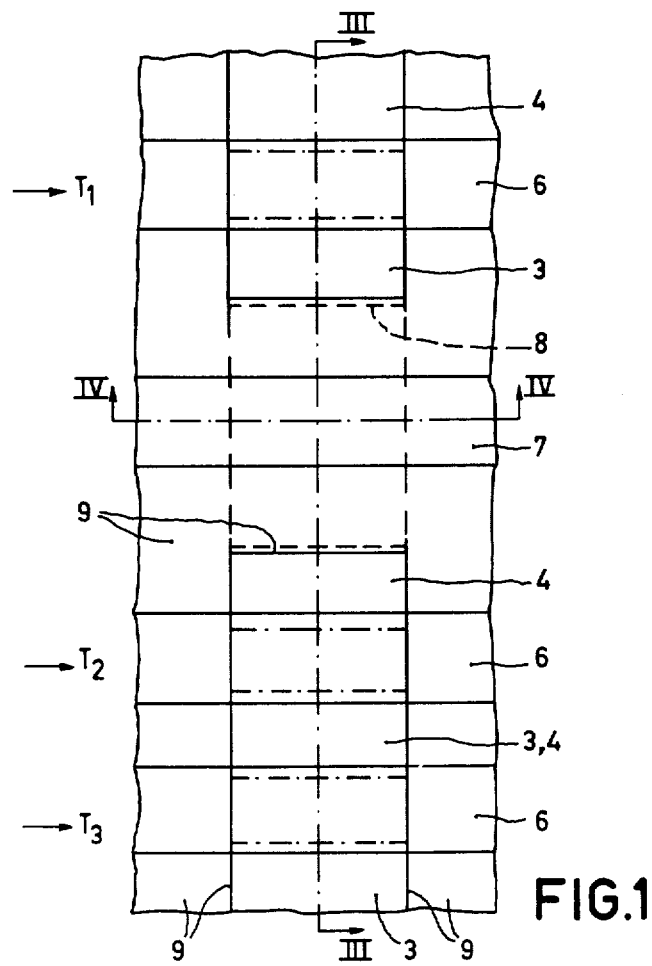
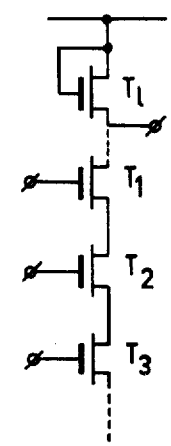
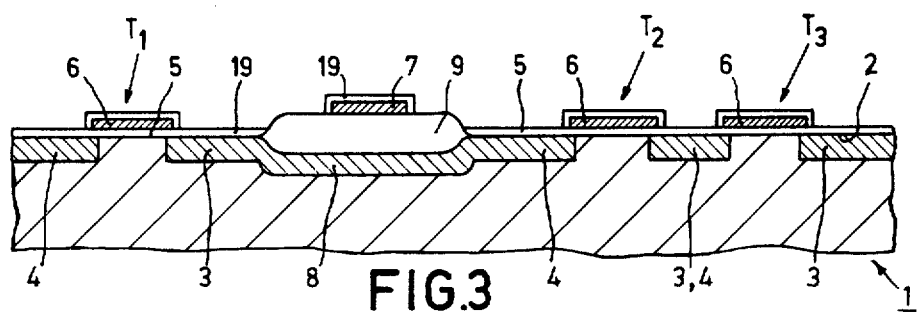

METHOD OF MANUFACTURING A SEMICONDUCTOR DEVICE

BACKGROUND OF THE INVENTION

The invention relates to a method of manufacturing a semiconductor device having a semiconductor body comprising a surface-adjoining region substantially of a first conductivity type in which at least two insulated gate field effect transistors are provided, the source and drain zones of which are formed by surface-adjoining zones of a second conductivity type, in which in the region of the first conductivity type at least one further surface zone of the second conductivity type is formed which constitutes a conductive connection between one of the source and drain zones of one of said two field effect transistors and one of the source and drain zones of the other of said two field effect transistors, in which starting from the semiconductor body of which at least the surface-adjoining region is of p-type silicon, a doping mask is provided at the surface of the body, said mask having an aperture at the area of the surface zone to be provided, in which, at the area of the field effect transistors to be provided, layer portions are present of a material masking the body against oxidation, in which via the aperture in the doping mask atoms selected from the group As and Sb are provided in the semiconductor body, after which the body with thereon an oxidation mask comprising the layer portions is subjected to an oxidation treatment so as to obtain an oxide pattern which is at least partly sunk in the semiconductor body and which extends beside the layer portions masking against oxidation and above the surface zone, in which during the oxidation treatment the As or Sb atoms provided in the body at the area of the surface zone diffuse deeper in the semiconductor body below and adjoining the sunken oxide to form the n-type surface zone, after which at the area of the field effect transistors to be formed the insulated gate electrodes are provided which, viewed on the surface, are situated on either side of and laterally spaced from the surface zone, and the source and drain zones of the field effect transistors adjoining the sunken oxide pattern are provided in a self-registering manner by means of doping with an impurity selected from the group P, As and Sb down to a depth at which the zones of the field effect transistors to be connected together adjoin the surface zone present below the sunken oxide pattern.

Such a method is disclosed in U.S. Pat. No. 4,101,344. In addition to a conductor pattern which is separated from the semiconductor body by insulating material and which connects the circuit elements together and to external supply conductors, the manufactured semiconductor device has a number of doped zones provided in the semiconductor body, which zones also serve to connect circuit elements together. Such doped zones, sometimes termed underpasses, inter alia present the advantage that crossing connections can be realized in the circuit in a comparatively simple manner. The underpasses constitute an extra layer of connections separated from the layer(s) of the insulated conductor pattern, as a result of which the whole connection pattern can become simpler and/or contact apertures for connecting circuit elements to the connection pattern can be saved.

Notably in integrated circuits in which the dimensions of the circuit elements are comparatively small, the space which is required for the whole connection pattern is decisive to a considerable extent of the semiconductor surface area required for the integrated circuit. In such circuits the use of underpasses can be of great usefulness. This applies in particular when the underpasses need occupy little space (surface area) and no critical alignment operations or other critical treatments are necessary during the manufacture for providing the underpasses.

Accurate alignment steps are preferably avoided generally in semiconductor technology. Such steps usually are rather laborious. In addition, the possibility of errors in the ultimate semiconductor device increases considerably with the number of critical operations during the whole manufacturing process. Furthermore, critical alignment steps can impose limits on the smallest dimensions and hence on the packing density of the device to be manufactured. In the underpasses obtained according to the method described in U.S. Pat. No. 4,101,344, the dimension thereof in the direction proceeding from one field effect transistor to the other is not particularly critical. If the layer portions masking against oxidation also prevent the penetration of doping material, the doping aperture in said direction is self-registering. When this is not the case, in so far as the aperture in the doping mask overlaps the oxidation mask and said overlap is not too large, then the dopant provided in the overlapping part will ultimately be present in the electrode zones of the field effect transistors. In the other direction transverse to the first-mentioned direction, however, the dimension of the underpass is fixed by the doping mask, the fact having to be taken into account that the doping mask and the oxidation mask have to be aligned relative to each other.

SUMMARY OF THE INVENTION

It is an object of the present invention to provide a method in which the aperture in the doping mask, at least in the transverse direction, is obtained in a self-registering manner relative to the oxidation mask, so that the aperture in the doping mask can be obtained with a less critical operation and the packing density of the integrated circuit can be increased.

According to the invention, the method described in the opening paragraph is characterized in that prior to the oxidation treatment, hereinafter termed second oxidation treatment, at least one other oxidation treatment, hereinafter termed the first oxidation treatment, is carried out in which the first oxidation treatment takes place after a first masking layer has been provided at the area of the further surface zone to be provided and the field effect transistors to be provided, which masking layer at least over a part of its thickness consists of a material differing from silicon oxide and masking against oxidation and in which by means of the first oxidation treatment an oxide pattern which is at least partly sunk in the semiconductor body is provided in a thickness which makes it suitable to form part of the doping mask, in which the doping mask is defined by means of a second masking layer which is provided over the first masking layer and over the oxide pattern and which covers at least two first parts of the first masking layer situated at the area of the field effect transistors to be provided and which does not cover a second part of the first masking layer and at least a third part of the oxide pattern adjoining said second part, the aperture of the doping mask coinciding substantially with the location of the second part of the first masking layer, the first parts of the first masking layer belonging to the oxidation mask which comprises the layer portions, the second oxidation treatment being carried out after at least the material of the second part of the first masking layer masking against oxidation has been removed.

The invention furthermore relates to a semiconductor device obtained by means of the method of the invention.

BRIEF DESCRIPTION OF THE DRAWING

The invention will be described in greater detail with reference to an embodiment and the accompanying diagrammatic drawing, in which FIG. 1 is a plan view of a part of a semiconductor device manufactured by using a method according to the invention, FIG. 2 shows the electric circuit diagram of a circuit arrangement which in integrated form can comprise the structure shown in FIG. 1, FIG. 3 is a cross-sectional view of the device shown in FIG. 1 taken on the line III—III of FIG. 1.

DESCRIPTION OF THE PREFERRED EMBODIMENTS

It is to be noted that the figures are diagrammatic only and are not drawn to scale.

Figure 4:
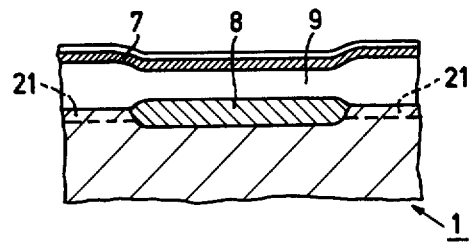
FIG. 4 is a sectional view of this device taken on the line IV—IV in FIG. 1, FIGS. 5, 8, 10 and 11 are sectional views taken on the line III—III in FIG. 1 during a few stages of the manufacture of the device.
Figure 5:
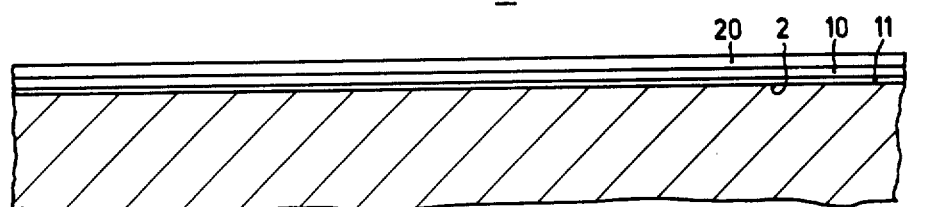
Figure 6:
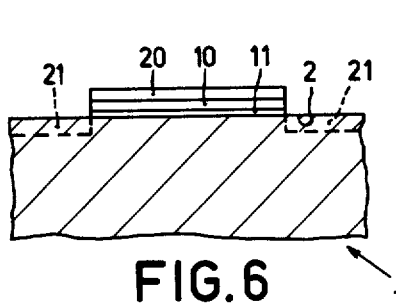
FIGS. 6, 7 and 9 are sectional views taken on the line IV—IV in FIG. 1 during a few stages of the manufacture of the device.

FIGS. 1, 3 and 4 show a part of a semiconductor device in the form of an integrated circuit having a number of insulated gate field effect transistors. The transistors are mutually connected in series and are referenced $T_1$, $T_2$ and $T_3$. FIG. 2 shows a specific electric circuit diagram with such series-arranged transistors. The transistors $T_1$, $T_2$ and $T_3$ each form an input of a so-called logic "not-and"-gate or "nand" gate, the output signal of which can be derived from the load transistor $T_1$. Gates of the kind shown in FIG. 2 may be combined in large numbers in a common body to form "crossbar"-like systems.

The device comprises a monolithic semiconductor body 1 which is mainly of a given conductivity type. Of course, alternatively, a non-homogeneously doped body may be used which comprises a partial layer of a first conductivity type adjoining the surface 2 and provided, for example, epitaxially, and a region or substrate of the second conductivity type opposite to the first conductivity type adjoining said partial layer.

The transistors $T_1$–$T_3$ each comprise a source zone 3 and a drain zone 4 in the form of zones of the opposite conductivity type adjoining the surface 2. It is to be noted that as a result of the specific circuit the drain zone 4 of, for example, transistor $T_3$ also forms the source zone 3 of transistor $T_2$ and that consequently the source zone 3 of $T_2$ and the drain zone 4 of $T_3$ are constructed as a common zone. In the plan view shown in FIG. 1 the boundaries of the source and drain zones 3, 4 are denoted by dot-and-dash lines.

The insulated gate electrodes 6 of the transistors $T_1$–$T_3$ are provided above the channel regions between the source and drain zones and separated therefrom by the intermediate dielectric layer 5. The device furthermore comprises a pattern of conductors so as to connect the various circuit elements together and to external conductors. In addition to, for example, a usual strip-shaped conductor 7 provided above the surface 2, said pattern of conductors comprises the surface zone 8 provided in the body 1 and being of the same conductivity type as the source and drain zones 3, 4 and opposite to the conductivity type of the body 1. The zone 8, sometimes termed underpass, which forms a connection between the drain zone 4 of $T_2$ and the source zone 3 of transistor $T_1$, is insulated from the conductor 7 by an intermediately located comparatively thick insulating layer 9. In FIG. 1 the underpass 8 is shown in broken lines.

Underpasses of the kind described and shown present very important advantages. First of all they considerably increase the interconnection possibilities and thus simplify generally the lay-out of the integrated circuit, in particular in the case in which the number of circuit elements is very large (L.S.I.). In addition, by using underpasses, the number of contact hoses, which are to be provided in the passivating layer 5 on the surface 2 for contacting zones 3, 4 by means of the usual conductor tracks provided on the passivating layer, can be restricted. A further important advantage is that the number of such conductor tracks can be reduced and hence there can be reduced, also, the possibility of short-circuits between said conductor tracks and the underlying semiconductor material via pinholes in the insulating passivating layer.

The structure described can be manufactured in a comparatively simple manner and substantially entirely in a self-registering manner by using a method which will be explained in greater detail with reference to FIGS. 5–11. The sectional views of FIGS. 5, 8, 10 and 11 correspond to the sectional view of FIG. 3 and the sectional views of FIGS. 6, 7 and 9 correspond to the sectional view of FIG. 4.

Starting material is semiconductor body 1 of which at least a partial layer or partial region adjoining the surface 2 is of p-type silicon and which semiconductor body in the present embodiment is entirely of the p-conductivity type. The resistivity of the body is between 1 and 40 Ohm.cm. If desired, the doping in a thin partial layer of the body adjoining the surface 2 can be increased and hence the resistivity be reduced, for example by means of ion implantation of a p-type impurity, so as to prevent at least locally the formation of n-type inversion channels adjoining the surface 2. The thickness of the semiconductor body 1 is approximately 400 $\mu$m; the lateral dimensions are assumed to be sufficiently large to be able to comprise the circuit to be manufactured.

In behalf of the first treatment, consisting of an oxidation treatment to which the semiconductor body is subjected, the body 1 is first provided with a mask. First of all, a layer which can mask the underlying silicon against oxidation is provided on the surface 2. Although other materials may also be used, silicon nitride is used in the present embodiment. The nitride layer may be provided, if desired, directly on the surface 2, but in most of the cases it is to be preferred, in order to avoid the possible occurrence of mechanical stresses in the nitride layer, to provide a thin oxide layer between the nitride layer and the semiconductor material. The nitride layer can be obtained in known manner, for example by heating in a mixture of $NH_3$ and $SiH_4$. The thickness of the nitride layer is, for example, between 0.15 and 0.2 μm. The thickness of the underlying silicon oxide layer which can be formed at the surface 2 by thermal oxidation of the body 1 is approximately 0.05 μm.

The silicon nitride layer is restricted, by means of an etching treatment, to layer portions situated above those portions of the semiconductor body 1 where underpasses and circuit elements are to be provided in a later stage of the production of, for example, field effect transistors or diodes and/or resistors. These layer portions are referenced 10 in FIGS. 5 and 6. The layer portions 10 leave the surface 2 of the body 1 and the thin oxide layer present thereon uncovered in places where thick field oxide will be provided.

In order to obtain the oxidation mask 10, 11 with the layer portions 10, an etching mask consisting of a photolacquer layer 20 may be provided on the silicon nitride layer (FIGS. 5 and 6) after which the silicon nitride is subjected to a material-removing treatment. The nitride can be removed in known manner, for example, by etching in a phosphoric acid solution at a temperature of approximately 150° C. or by so-called plasma etching. The silicon oxide layer can then also be removed locally by means of the same mask so that only the portions 11 thereof remain.

Instead of providing body 1 with a more highly doped partial layer adjoining the surface at the point mentioned above, a more highly doped p-type surface layer 21 may also be provided in this stage of the manufacture in a manner known per se. If the photolacquer layer 20 is first removed, the surface layer 21 may be provided by doping from the gaseous phase at elevated temperature. The surface layer may also be provided by means of ion implantation of a p-type impurity. This implantation may be carried out prior to or after the removal of the photolacquer layer 20. In case implantation is used, the above-mentioned thin oxide layer furthermore need not be etched and not be restricted to the portions 11. Implantation then takes place through the oxide layer.

The advantage of the locally provided surface layer 21 is that said layer 21 leaves exposed not only the surface regions occupied by the transistors and the possible other circuit elements but also the surface regions occupied by the underpasses.

An oxidation treatment which in the scope of the present invention is termed a first oxidation treatment is then carried out. This treatment lasts approximately 35 minutes and takes place at approximately 1000° C. The resulting oxide layer 22 (FIG. 7) should be at least sufficiently thick to be able to mask during the doping treatment to be carried out to obtain the underpasses. In the present example the thickness of the oxide layer 22 is approximately 0.25 μm.

Within the scope of the present invention the oxidation mask 10, 11 is termed the first masking layer.

Figure 7:
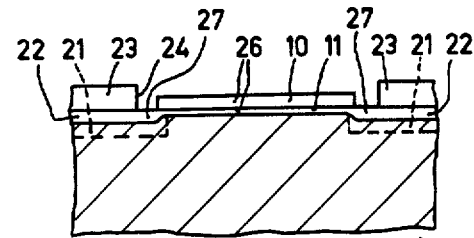
Figure 8:
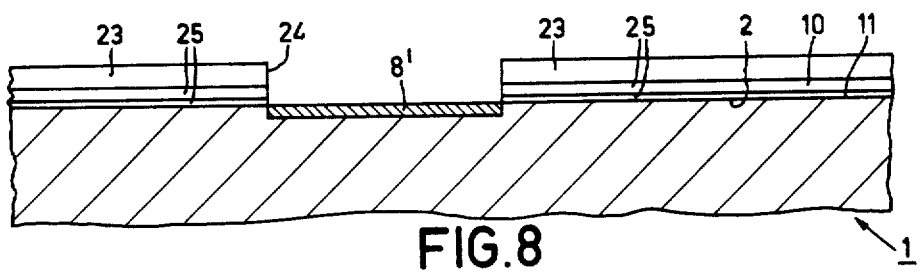

After the first oxidation treatment a doping mask is defined by means of a second masking layer 23 which is provided over the first masking layer 10, 11 and over the oxide pattern 22. The second masking layer 23 may be, for example, a photolacquer layer. The photolacquer layer 23 is provided with an aperture 24 (FIGS. 7 and 8). The photolacquer layer covers at least two first portions 25 (FIG. 8) of the first masking layer situated at the area of the field effect transistors to be provided and leaves a second portion 26 (FIG. 7) and at least a portion 27 of the oxide pattern 22 adjoining said second portion 26 exposed. The portion 26 of the first masking layer 10, 11 exosed in the aperture 24 can be removed in the usual manner. Usually, only the layer portion 10 in the aperture 24, i.e., the silicon nitride, will be removed. If necessary, however, the layer portion 11, i.e., the silicon oxide, may also be etched away. It is to be noted that the oxide layer portion 11 (0.05 μm) is considerably thinner than the oxide pattern 22 so that during the removal of the portion of the oxide layer 11 present in the window 24 the exposed portions of the oxide pattern 22 are substantially not attacked.

The doping treatment for the underpasses may be carried out from the gaseous phase at elevated temperature or by means of ion implantation. In the latter case, also dependent on the energy chosen, the implantation may be carried out either prior to or after the removal of the photolacquer layer 23 and/or either prior to or after the removal of the layer portion 10 and/or the layer portion 11 of the second portion 26. The doping atoms are selected from the group As and Sb. In the present example, after removing the second portion 26 and the photolacquer layer 23, As atoms are implanted at an energy of approximately 40 KeV. The dose is approximately $1 \times 10^{15}$ atoms/cm$^2$. The resulting doped zone is shown diagrammatically by the zone 8' in FIGS. 8 and 9. The doping mask used consists of plural first parts 25 of the first masking layer 10, 11 situated at the area of the field effect transistors to be provided and the oxide pattern 22. The aperture in the doping mask coincides substantially with the location of the second portion 26 of the first masking layer 10, 11 which in this example was removed prior to the doping treatment.

Figure 9:
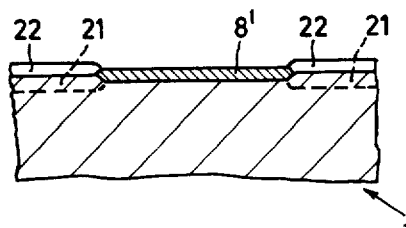
Figure 10:
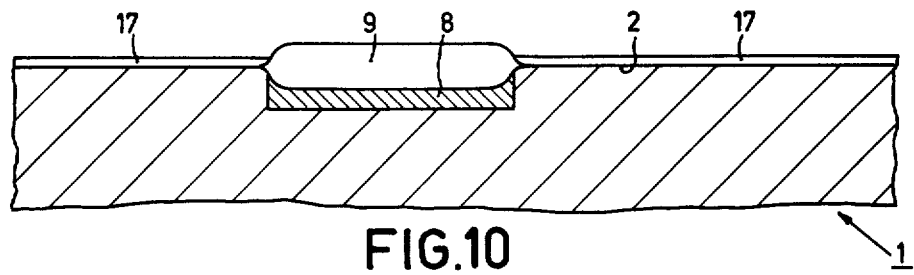

After the zone 8' has been provided and the semiconductor body 1 is in a condition as shown in FIG. 9, a second oxidation treatment may be carried out, for example, at approximately 1100° C. and for approximately 9 hours. The As atoms provided in the zone 8' diffuse deeper into the semiconductor body 1 and the underpass 8 is formed with thereabove a comparatively thick oxide pattern 9 (FIGS. 3 and 4) sunk in the semiconductor body 1 over a part of its thickness. The thickness of the oxide pattern is, for example, approximately 1.8 μm. The sheet resistance of the underpass 8 proves to be approximately 100 Ohm per square.

The thickness of the surface zone 8, taken from the original surface 2, is approximately 1.5 μm, which proves to be a favorable value in connection with the lateral diffusion (parallel to the surface) which is of a comparable value to the vertical diffusion (perpendicular to the surface) of arsenic.

After the second oxidation treatment the thick field oxide 9 of the device is substantially complete. The oxide pattern 9 shown in FIG. 1 by solid lines surrounds the circuit elements of the device and also covers the underpass(es). FIG. 4 shows diagrammatically a difference in thickness of the pattern. The part situated above the more highly doped surface layer 21 is drawn to be thicker than the part situated above the underpass 8. This difference in thickness may be small and may even be substantially absent. The value of the difference in thickness can be influenced inter alia by a suitable choice of the thickness of the pattern 22 obtained in the first oxidation treatment and/or by removing the pattern 22 entirely or for a part of its thickness prior to the second oxidation treatment.

The field effect transistors $T_1-T_3$ can now be formed in the apertures of the oxide pattern 9.

After the oxidation treatment, the gate electrodes of the field effect transistors to be manufactured could be provided directly on the silicon nitride layer portion 10, the nitride layer portion 10 and the underlying oxide layer portion 11 forming the gate dielectric of the transistors. In most of the cases, however, it is to be preferred to remove the nitride layer 10 and the oxide layer 11 entirely and replace it by a fresh insulating layer 17 (FIG. 10) which in the present example consists only of a silicon oxide layer in a thickness of approximately 0.1 $\mu$m but which may also consist of other materials, for example, silicon nitride or aluminium oxide or of a combination of various layers.

Figure 11:
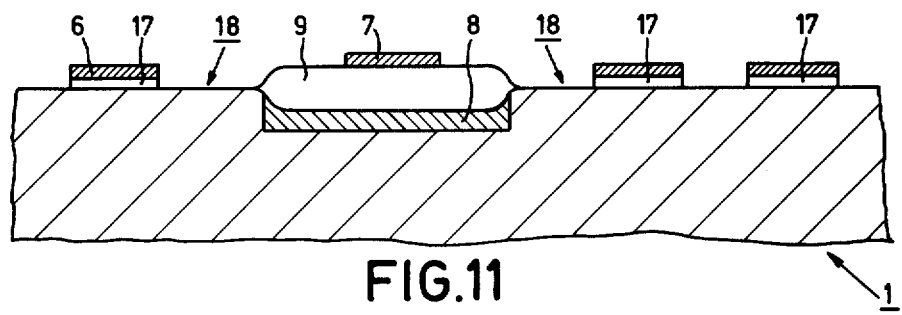

The strips 6 which are to form the insulated gate electrodes of the transistors are then provided on the oxide layer 17. Simultaneously with the gate electrodes 6 a conductor 7 is provided which crosses the underpass 8. The strips 6 and 7 are manufactured from polycrystalline silicon and can be provided in generally known manner. As appears from FIG. 11, gate electrodes 6 are provided on either side of the underpass 8 in such manner that some distance remains between said electrodes and the sunken oxide above the underpass 8. The gate electrodes 6 are laterally spaced from the sunken oxide. The oxide layer 17 is subjected to an etching treatment and is removed in so far as it is not covered by the polycrystalline silicon layers 6, 7. During said etching treatment it is not necessary to mask the sunken oxide pattern 9 because the etching treatment can take place in a very short time as a result of the small thickness of the oxide layer 17 without noteworthily attacking the very thick oxide pattern 9. FIG. 11 shows the device in this stage of the process. In a self-registering manner, the n-type zones 3 and 4 of the transistors $T_1$ and $T_2$ can be provided via the surface portions 18 defined by the gate electrodes 6 and the sunken oxide pattern 9, which zones should be connected together by the n-type zone 8 forming the underpass. The zones 3, 4 can be provided by diffusing an n-type impurity, for example, phosphorus atoms, into the body via the surface parts 18. In this doping step, phosphorus is to be preferred to arsenic or antimony due to the higher diffusion rate of phosphorus. It has been found that when the phosphorus atoms are diffused down to a depth of approximately 1.5 $\mu$m from the surface into the body, a good low-ohmic connection can be produced between said zones and the arsenic-doped underpass 8. Simultaneously with the zones 3 and 4 of the transistors $T_1$ and $T_2$, respectively, the remaining zones of said transistors and zones of other circuit elements, for example, the zone 3 of transistor $T_3$, can also be provided. In addition, during said doping step the polycrystalline strips 6 and 7 may be doped with phosphorus so as to reduce their resistance. In the case in which the diffusion takes place in an oxidizing medium, an oxide layer 19 may grow in addition above the source and drain zones of the transistors to be provided (FIG. 3) while the polycrystalline strips 6 and 7 can also be oxidized partly. The semiconductor body shown in the sectional view of FIG. 3 may be subjected to further treatments which are generally known to those skilled in the art. For example, contact holes may be etched in the oxide layers 19 after which a second conductor track of, for example, aluminum is provided on the device and is contacted to the circuit elements via said contact holes.

It is to be noted that the process described is very simple as compared with known processes of manufacturing integrated circuits having field effect transistors. By using the method according to the invention, an underpass 8 can be obtained in such an integrated circuit in a substantially self-registering manner.

It will be obvious that the invention is not restricted to the embodiment described but that many variations are possible to those skilled in the art without departing from the scope of this invention.

For example, the source and drain zones 3, 4 of the transistors may be provided by means of ion implantation instead of by diffusion, in which, if desired, the ions may be implanted through the oxide layer 17 with sufficiently high energy so that it will not be necessary in that case to remove the oxide layer 17 at the area of the surface parts 18 (see FIG. 11).

The polycrystalline silicon layers 6, 7 may be doped simultaneously with the deposition of the polycrystalline material instead of simultaneously with the source and drain zones 3, 4 of the transistors, or after providing but prior to patterning the deposited layer.

In a modified embodiment of the method described, an oxide layer 11 is used in a thickness of approximately 0.04 $\mu$m on which a nitride layer 10 of approximately 0.075 $\mu$m is provided. After the mask consisting of the parts 25 and 26 has been formed and the doping has been implanted for the local surface layer 21 (for example boron ions with an energy of approximately 25 KeV; dose approximately $3 \times 10^{13}/cm^2$), the first oxidation treatment is carried out at approximately 1000° C. In this case also, oxidation is carried out until a layer 22 has been obtained which is approximately 2500 Å thick. The second masking layer 23 is then formed and provided with the aperture 24. The silicon nitride layer portion 10 in the aperture 24 is removed while the silicon oxide layer portion 11 remains present on the semiconductor surface. An implantation treatment is then carried out in which As ions with an energy of approximately 100 KeV are provided into the semiconductor body through the part of the oxide layer portion 11 exposed in the aperture 24. The peak of the concentration profile of the arsenic doping in the semiconductor body lies below the semiconductor surface. The second masking layer 23 is then removed.

The second oxidation treatment is also carried out at approximately 1000° C. Such treatments are carried out in an oxidizing atmosphere preferably containing a small quantity of HCl. The treatment is continued until the thickness of the field oxide above the surface layer 21 is approximately 0.5 $\mu$m. It has surprisingly been found that the thickness of the field oxide above the underpass 8 then is substantially equally large, namely also approximately 0.5 $\mu$m. The presence of the doping in the zone 8' presumably causes at that area a comparatively rapid growth of the oxide layer. It is to be noted that the first oxide layer 22 has been made slightly thicker than is necessary for the masking of the arsenic implantation. The chosen combination of thicknesses and oxidation treatments yield, after the arsenic implantation and the second oxidation treatment, a field oxide which is equally thick substantially everywhere. Especially in manufacturing comparatively small field effect transistors with comparatively thin field oxide, preferably thinner than 1 $\mu$m, it may be advantageous to realize a field oxide of substantially uniform thickness by matching the oxidation treatment.

Also in other integrated circuits with oxide layers which are sunk in the semiconductor body over at least part of their thickness and in which said oxide layers are comparatively thin and have been obtained by two or more oxidation treatments, it may be advantageous to prevent or reduce differences in thickness of the oxide layers by a suitable choice of the conditions and the time duration of the various oxide treatments in combination with a suitable locally carried out doping treatment.

In the present modified embodiment of the method, the oxidation mask which now consists of the parts 25 is entirely removed after the second oxidation treatment. A fresh oxide layer 5 is then provided in a thickness of approximately 0.05 μm. A layer of polycrystalline silicon of approximately 0.35 μm is provided over said oxide layer 5, for example, by deposition from the gaseous phase at reduced pressure and a temperature of approximately 650° C. The deposited silicon layer may be doped with phosphorus from the gaseous phase at approximately 950° C., for example, after the deposition. After removing the phosphorus glass, the silicon layer is patterned to form the gate electrodes 6 and the conductor tracks 7. The electrode zones 3, 4 are obtained by implantation of arsenic through the oxide layer 5 at 150 KeV with a dose of approximately $4 \times 10^{15}/cm^2$. The polysilicon conductors 6 and 7 are provided with approximately 0.07 μm oxide by oxidation. If desired, a further oxide layer may then be deposited from the gaseous phase. This deposited oxide layer may have a thickness of approximately 0.4 μm. Apertures can be provided in the usual manner in the oxide layer for contacting semiconductor zones 3, 4 and/or polycrystalline conductor tracks 6, 7. Inter alia to improve the passivation and to prevent possible contacting problems in the apertures in the oxide layer, an implantation treatment with phosphorus may be carried out, for example, at 25 KeV with a dose of approximately $5.10^{15}/cm^2$. After a thermal treatment of, for example, approximately 20 minutes at approximately 950° C., further conductor tracks, for example, of aluminum or another suitable material may be provided.

Figure 12:
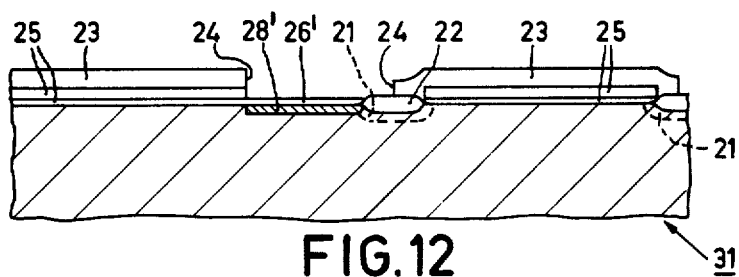
FIGS. 12 and 13 are sectional views in stages of the manufacture of a part of a semiconductor device which can be obtained when using a method in accordance with the invention.
Figure 13:
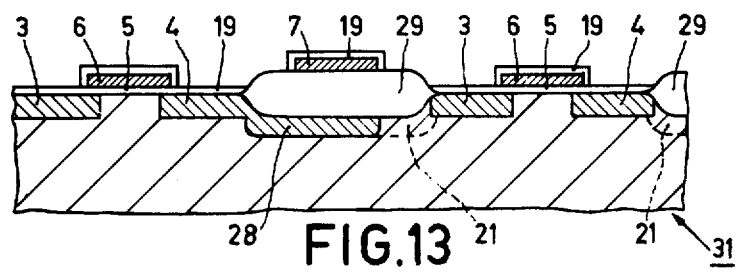

For completeness' sake it is to be noted that the treatments described above are all of a conventional type with which those skilled in the art are familiar. Further detailed information on the practical performance may therefore be omitted In addition to the underpasses described, capacitances can also be obtained by means of the method described. A possible embodiment is shown in FIGS. 12 and 13. FIG. 12 shows the semiconductor body 31 after the first oxidation treatment, in which the oxide layer 22 is obtained. (In FIGS. 12 and 13 corresponding components are referred to by the same reference numerals as in FIGS. 1 and 3 to 11). The doping for the more highly doped surface layer 21 is present below the oxide layer 22 The mask with the parts 25 and 26' is present on the surface in which the part 26' shown consists of the remaining oxide layer portion of the original part 26. Furthermore shown is the second masking layer 23 with the aperture 24 therein. The layer 28' is obtained locally by doping with the aid of the doping mask which comprises the photolacquer layer 23, the parts 25 and the oxide layer 22. After the second oxidation treatment, field effect transistors can be provided in the usual manner. FIG. 13 shows that the left-hand transistor has an electrode zone 4 which adjoins a zone 28 underlying the field oxide 29 and also terminating below said field oxide. Herewith an increase of the capacitance of the electrode zone 4 relative to the semiconductor substrate is obtained. The zone 28 is separated from the electrode zone 3 of the right-hand transistor by the more highly doped surface part 21.

It is to be noted that the electrode zone 4 adjoining the zone 28 does not necessarily also form part of a transistor or another circuit element. The zone 4 may also serve exclusively as a contact zone for the resulting capacitance. Furthermore, in order to further increase the capacitance an implantation may also be carried out, for example, of boron ions through the aperture 24. Similarly, a zone 28 fully underlying the oxide pattern 9 may also be obtained which in a direction transverse to the plane of the drawing of FIG. 3 adjoins the underpass 8.

From the above it will be obvious that by the use of the present invention integrated circuits are realized having one or more underpasses the boundary of which in a direction transverse to the direction of electric current flow in the underpass is derived in a self-registering manner from the mask with which the regions of the semiconductor surface occupied by the circuit element are fixed. Transversely to the electric current flow direction, the underpass and the semiconductor surface zones connected together via the underpass may have substantially the same dimension. This means inter alia that, in addition to the row of transistors $T_1$, $T_2$, $T_3$, shown in FIG. 1, similar transistor rows can be provided at a comparatively short distance. The packing density of the integrated circuit thus becomes comparatively high and often a higher switching speed is also realized. Instead of in one operation the field oxide is obtained in two successive operations. As described, the doping for the underpass or generally the doped zone situated substantially entirely below the field oxide, may be provided between these two operations. The oxide obtained during the first oxidation treatment can be maintained at will or be removed entirely or partly prior to the second oxidation treatment.

What is claimed is:

1. A method of manufacturing a semiconductor device having a semiconductor body comprising a surface and a surface-adjoining region substantially of p-type silicon wherein at least two insulated gate field effect transistors are provided whose source and drain zones are formed by n-type surface-adjoining zones and wherein at least one further n-type surface zone is formed that constitutes a conductive connection between one of the source and drain zones of one of the two transistors and one of the source and drain zones of the other of the two transistors, in which method layer portions of a material masking the body against oxidation are provided at the areas intended for the transistors, a doping mask having an aperture at the area intended for the surface zone is provided at the surface, atoms selected from the group consisting of As and Sb are introduced through the aperture into the body, the body is subjected to an oxidation treatment using an oxidation mask comprising the layer portions (1) to obtain an oxide pattern which is sunk at least partly in the body and which extends beside the layer portions and above the surface zone and (2) to cause the As or Sb atoms to diffuse deeper into the body below and adjoining the oxide pattern so as to form the surface zone, insulated gate electrodes for the two transistors are then provided on both sides of and laterally spaced from the surface zone, and the source and drain zones are provided by introducing an impurity selected from the group consisting of P, As and Sb into the body in a self registering manner down to a depth at which the pair of source and drain zones that are connected together adjoin the surface zone below the oxide pattern, characterized in that: prior to the oxidation treatment, hereinafter termed the second oxidation treatment, a first masking layer that consists over at least part of its thickness of a material differing from silicon oxide and masking against oxidation is provided at the areas intended for the surface zone and the transistors and then at least one other oxidation treatment, hereinafter termed the first oxidation treatment, is carried out to obtain a first oxide pattern which is sunk at least partly in body and which has a thickness that makes the first oxide pattern suitable to form part of the doping mask; the doping mask is defined by means of a second masking layer which is provided over the first masking layer and over the first oxide pattern and which covers at least two first parts of the first masking layer at the areas intended for the transistors and which does not cover a second part of the first masking layer and at least a third part of the first oxide pattern adjoining the second part, the aperture coinciding substantially with the location of the second part, the first parts belonging to the oxidation mask; and the second oxidation treatment is carried out after removing at least the material of the second part that masks against oxidation.

* * * * *